US009396982B2

(12) United States Patent
Chew et al.

(10) Patent No.: US 9,396,982 B2
(45) Date of Patent: Jul. 19, 2016

(54) SEMICONDUCTOR DEVICE CARRIER FOR FINE PITCH PACKAGING MINIATURIZATION AND MANUFACTURING METHOD THEREOF

(75) Inventors: Hwee-Seng Jimmy Chew, Singapore (SG); Chee Kian Ong, Singapore (SG); Bin Chichik Abd. Razak, Singapore (SG)

(73) Assignee: ADVANPACK SOLUTIONS PTE LTD., Singapore (SG)

( * ) Notice: Subject to any disclaimer, the term of this patent is extended or adjusted under 35 U.S.C. 154(b) by 0 days.

(21) Appl. No.: 12/292,813

(22) Filed: Nov. 26, 2008

(65) Prior Publication Data

US 2009/0102043 A1    Apr. 23, 2009

Related U.S. Application Data

(63) Continuation of application No. 11/898,717, filed on Sep. 14, 2007, now Pat. No. 7,795,071, which is a continuation-in-part of application No. 11/882,194, filed on Jul. 31, 2007, now abandoned.

(30) Foreign Application Priority Data

Dec. 14, 2006 (TW) .............................. 95146945 A

(51) Int. Cl.
*H01L 23/48* (2006.01)
*H01L 21/683* (2006.01)
(Continued)

(52) U.S. Cl.
CPC ...... *H01L 21/6835* (2013.01); *H01L 23/49816* (2013.01); *H01L 23/49861* (2013.01);
(Continued)

(58) Field of Classification Search
CPC ..................... H01L 21/6835; H01L 23/49816; H01L 23/49861; H01L 2924/00013; H01L 2924/01068; H01L 24/13; H01L 2924/01079; H01L 24/16; H01L 2224/16; H01L 2224/131; H01L 2221/68345
USPC .................. 257/E23.004, E23.062, E23.125, 257/E23.135
See application file for complete search history.

(56) References Cited

U.S. PATENT DOCUMENTS

| 5,248,854 A | 9/1993 | Kudoh et al. |
| 5,440,805 A | 8/1995 | Daigle et al. |

(Continued)

FOREIGN PATENT DOCUMENTS

| CN | 1585114 A | 2/2005 |
| CN | 100437987 C | 11/2008 |

(Continued)

OTHER PUBLICATIONS

Foreign Office Action issued on Apr. 2, 2013 with an English translation.

(Continued)

*Primary Examiner* — Ermias Woldegeorgis
(74) *Attorney, Agent, or Firm* — Rabin & Berdo, P.C.

(57) ABSTRACT

A semiconductor package and a manufacturing method thereof are provided. The package element has a first insulating layer, and a plurality of holes are disposed on the first surface of the first insulating layer. Besides, a plurality of package traces are embedded in the insulating layer and connected to the other end of the holes. The holes function as a positioning setting for connecting the solder balls to the package traces, such that the signal of the semiconductor chip is connected to the package trace via conductor of the chip, and further transmitted externally via solder ball. The elastic modulus of the material of the first insulating layer is preferably larger than 1.0 GPa.

10 Claims, 11 Drawing Sheets

(51) Int. Cl.
*H01L 23/498* (2006.01)
*H01L 23/00* (2006.01)

(52) U.S. Cl.
CPC .............. *H01L24/13* (2013.01); *H01L 24/16* (2013.01); *H01L 2221/68345* (2013.01); *H01L 2224/131* (2013.01); *H01L 2224/16* (2013.01); *H01L 2924/00013* (2013.01); *H01L 2924/01068* (2013.01); *H01L 2924/01079* (2013.01)

(56) References Cited

U.S. PATENT DOCUMENTS

| | | | |
|---|---|---|---|
| 5,481,798 A | 1/1996 | Ohsawa et al. | |
| 5,608,265 A | 3/1997 | Kitano et al. | |
| 5,877,559 A | 3/1999 | Takayama et al. | |
| 6,051,450 A * | 4/2000 | Ohsawa et al. | 438/123 |
| 6,114,755 A * | 9/2000 | Ito et al. | 257/675 |
| 6,230,400 B1 * | 5/2001 | Tzanavaras et al. | 29/840 |
| 6,294,840 B1 | 9/2001 | McCormick | |
| 6,528,869 B1 | 3/2003 | Glenn et al. | |
| 6,563,202 B1 * | 5/2003 | Ohsawa et al. | 257/673 |
| 6,570,263 B1 | 5/2003 | Wu et al. | |
| 6,784,376 B1 | 8/2004 | Huemoeller et al. | |
| 7,145,238 B1 | 12/2006 | Huemoeller et al. | |
| 7,474,538 B2 | 1/2009 | Kikuchi et al. | |
| 8,183,088 B2 * | 5/2012 | Jeon et al. | 438/106 |
| 8,865,525 B2 | 10/2014 | Lin et al. | |
| 8,866,301 B2 | 10/2014 | Lin et al. | |
| 2001/0010945 A1 | 8/2001 | Miyazaki | |
| 2001/0017221 A1 | 8/2001 | Horiuchi et al. | |
| 2002/0025607 A1 | 2/2002 | Danno et al. | |
| 2003/0045024 A1 * | 3/2003 | Shimoto et al. | 438/106 |
| 2003/0057568 A1 | 3/2003 | Miyazaki | |
| 2003/0194855 A1 | 10/2003 | Park et al. | |
| 2004/0168825 A1 | 9/2004 | Sakamoto et al. | |
| 2005/0088833 A1 * | 4/2005 | Kikuchi et al. | 361/763 |
| 2006/0180911 A1 * | 8/2006 | Jeong et al. | 257/686 |
| 2006/0192287 A1 | 8/2006 | Ogawa et al. | |
| 2007/0126127 A1 | 6/2007 | Jobetto et al. | |
| 2009/0046441 A1 | 2/2009 | Funaya et al. | |
| 2009/0291530 A1 | 11/2009 | Jimmy et al. | |
| 2011/0210442 A1 | 9/2011 | Lim et al. | |
| 2012/0153463 A1 | 6/2012 | Maeda | |
| 2012/0153466 A1 | 6/2012 | Chew et al. | |
| 2013/0020710 A1 | 1/2013 | Chew et al. | |
| 2013/0175707 A1 | 7/2013 | Chew et al. | |

FOREIGN PATENT DOCUMENTS

| | | |
|---|---|---|
| CN | 102132404 A | 7/2011 |
| EP | 0 446 656 A1 | 9/1991 |
| JP | 04-145634 | 5/1992 |
| JP | 04145634 A | 5/1992 |
| JP | 07-170069 | 7/1995 |
| JP | 10-125819 | 5/1998 |
| JP | 10125818 | 5/1998 |
| JP | 2001-168130 A | 6/2001 |
| JP | 2002-222895 A | 8/2002 |
| JP | 2002-261190 A | 9/2002 |
| JP | 2006066517 A | 3/2006 |
| JP | 2006-216919 A | 8/2006 |
| JP | 2008-153622 A | 7/2008 |
| TW | 544823 B | 8/2003 |

OTHER PUBLICATIONS

Office Action issued by the USPTO on May 2, 2014 for related U.S. Appl. No. 12/534,166.
Office Action issued by the USPTO on Nov. 27, 2013 for related U.S. Appl. No. 12/826,307.
Chinese Office Action dated Jan. 21, 2015.
USPTO Office Action issued on Dec. 10, 2015 for U.S. Appl. No. 13/689,207.
USPTO Office Action issued on Jan. 15, 2015 for U.S. Appl. No. 12/826,307.
USPTO Office Action issued on Jan. 23, 2015 for U.S. Appl. No. 12/534,166.
USPTO Office Action dated Jun. 26, 2015 in U.S. Appl. No. 13/689,207.
USPTO-provided Translation of Chinese Office Action dated Jan. 21, 2015.
Chinese Office Action dated Aug. 10, 2015.
Japanese Office Action dated Aug. 4, 2015 and its English translation.

* cited by examiner

SEMICONDUCTOR DEVICE CARRIER FOR FINE PITCH PACKAGING MINIATURIZATION AND MANUFACTURING METHOD THEREOF

RELATED APPLICATIONS

This is a Continuation of U.S. application Ser. No. 11/898,717, filed Sep. 14, 2007, which was a Continuation-in-part of U.S. application Ser. No. 11/882,194, filed Jul. 31, 2007 the subject matters of which are incorporated herein by reference.

BACKGROUND OF THE INVENTION

1. Field of the Invention

The invention relates in general to a semiconductor package and manufacturing method thereof, and more particularly to a semiconductor package whose lead frame can be independently isolated and transported during the manufacturing process.

2. Description of the Related Art

Along with the advance in science and technology, the demand for various electronic products is booming. Meanwhile, as miniaturization is expected of electronic products by consumers, the semiconductor element, a crucial element used in an electronic product, is also directed towards the design of miniaturization, and the reduction in the pitch and width of the circuit of a semiconductor element has always been an important direction in the semiconductor industry. However, in addition to the reduction in the pitch and width of the circuit inside a semiconductor chip, the chip package carrying the signal and extended to the external also plays an important part in the miniaturization of a semiconductor element. If the circuit and pitch of a semiconductor package can not be effectively reduced, the miniaturization in the size of a semiconductor element using the same will be very limited.

For example, the thickness of a metallic trace of a conventional package normally ranges between 120~250 micrometer, and a package trace is formed after the process of microfilming, exposure and etching. However, the etching process restricts the pitch and width of a circuit, and the undercutting effect will affect the reliability of the package trace. Therefore, the conventional lead frame of the package trace is not suitable to the miniaturization in semiconductor element.

Thus, how to resolve the above problem of element miniaturization and simplify the manufacturing process of the package has become an important direction in the research and development of semiconductor package.

SUMMARY OF THE INVENTION

According to a first aspect of an embodiment of the present invention, a semiconductor package is provided. The semiconductor package comprises a first insulating layer and a plurality of package traces, wherein a plurality of holes are disposed on a first surface of the first insulating layer, and the package traces are embedded in the insulating layer and connected to another end of the holes.

According to an aspect of another embodiment of the present invention, a semiconductor package is provided. The semiconductor package comprises a first insulating layer, a plurality of positioning units and a plurality of package traces. The elastic modulus of the first insulating layer is larger than 1.0 GPa. The positioning units are disposed on the first insulating layer. The package traces are disposed under the positioning unit.

According to an aspect of another embodiment of the present invention, a manufacturing method of a semiconductor package is provided. The manufacturing method comprises the following steps. Firstly, a carrier is provided. Next, a plurality of traces are formed on the carrier. Then, a first insulating layer is formed on the traces. Afterwards, a plurality of positioning units are formed on a first surface of the first insulating layer next, wherein the positioning unit contacts the trace directly.

According to an aspect of another embodiment of the present invention, a method of manufacturing a semiconductor package is provided. The method of manufacturing the semiconductor package comprises the following steps. Firstly, a carrier is provided. Then, a plurality of electrically isolated package trace layout units are formed by a first conductive layer, wherein the package trace layout unit is formed by a plurality of electrically isolated package traces. Afterwards, a patterned second conductive layer is formed on the first conductive layer. Then a first insulating layer is formed by a molding material and embedded in the first conductive layer and the second conductive layer. After that, part of the carrier is selectively removed.

The invention will become apparent from the following detailed description of the preferred but non-limiting embodiments. The following description is made with reference to the accompanying drawings.

DETAILED DESCRIPTION OF THE INVENTION

First Embodiment

Figure 1:
FIG. 1 to FIG. 8 are process flowcharts of manufacturing an independent semiconductor package according to a first embodiment of the invention.
Figure 2:
Figure 3:
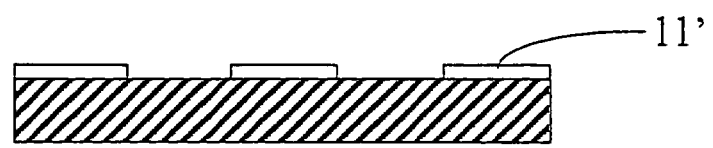

Referring to FIG. 1 onwards, process flowcharts of manufacturing an independent semiconductor package according to a first embodiment of the invention are shown. Firstly, a carrier 10 is provided. In the present embodiment of the invention, the carrier 10 is a steel piece. Then, referring to FIG. 2, a photo-resist layer 11 is formed on the carrier 10 first, and further shaped as a patterned photo-resist layer 11' as indicated in FIG. 3.

Figure 4:
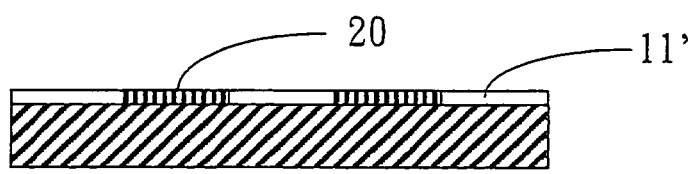
Figure 5:
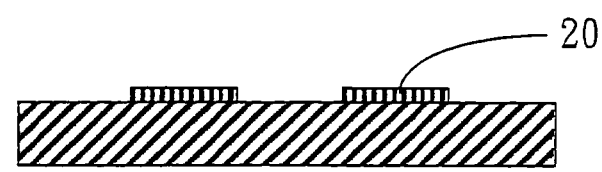

Referring to FIG. 4, a conductive layer 20 is formed in the empty part of the photo-resist layer 11', wherein the thickness of the conductive layer 20 normally between ranges 0.01~0.4 mm, but preferably ranges between 0.025~0.035 mm. In the present embodiment of the invention, the conductive layer 20 is formed by electroplating. As indicated in FIG. 5, the photo-resist layer 11' is removed, but the conductive layer 20 (the first conductive layer) is left and used as package traces not the traces inside a semiconductor chip. In the present embodiment of the invention, a plurality of package traces formed by the conductive layer 20 are preferably electrically isolated and used as a package trace layout unit. In practical application, the package traces are electrically connected to each other. During the process of formation, a plurality of package trace layout units are formed, and each package trace layout unit substantially has the same pattern and individually corresponds to a to-be-packaged chip.

Figure 6:
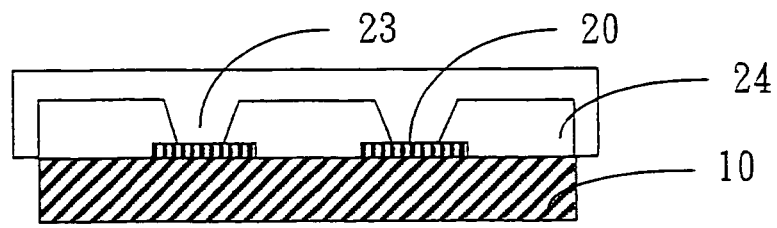
Figure 7:
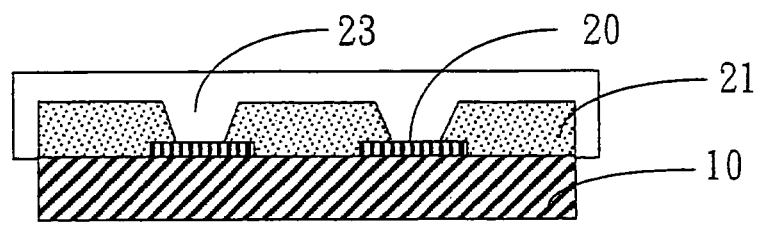

Referring to FIG. 6, a mold 23 is provided, wherein the mold 23 has a plurality of protrusions corresponding to the position of the trace layer 20. A plurality of mold cavities 24 are formed in the mold 23. Then, an insulating material is infused in the mold cavities 24 to form a first insulating layer 21, wherein the thickness of the first insulating layer 21 normally ranges between 0.1~0.4 mm, but preferably ranges between 0.18~0.22 mm. As indicated in FIG. 7, a plurality of package traces are embedded in the first insulating layer 21 or disposed in the first insulating layer 21 and extended to a surface of the first insulating layer 21. In the present embodiment of the invention, the insulating material is a molding material, the elastic modulus of the insulating material is larger than 1.0 GPa, and preferably the CTE value of the insulating material is less than 10 ppm. In practical application, the first insulating layer 21 is not necessarily limited to one layer. Any one who is skilled in the technology of the invention can use several materials to compose a compound insulating layer in several times of formation or use the same material to compose an insulating layer in several times of formation, and such modifications are still within the scope of protection of the invention. However, in the present embodiment of the invention, the first insulating layer 21 is formed from a single material, such that the package traces are embedded in the first insulating layer 21. That is, the height of the first insulating layer 21 must be larger than the height of the package traces.

Figure 8:
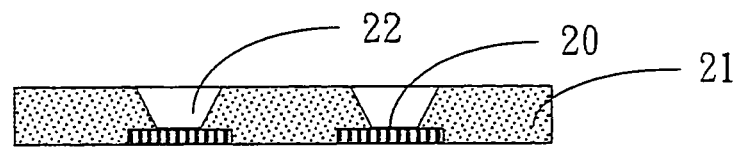

As a plurality of protrusions disposed on the mold 23 correspond to the trace layer 20, a plurality of holes 22 are formed on a surface of the first insulating layer 21. Referring to FIG. 8, the mold 23 and the carrier 10 are removed, and a semiconductor package that can be transported independently is formed. In the present embodiment of the invention, the other end of the holes 22 contacts the package trace of the trace layer 20, wherein the holes used as positioning units for connecting the conductors are made from the trace layer 20

Figure 9:
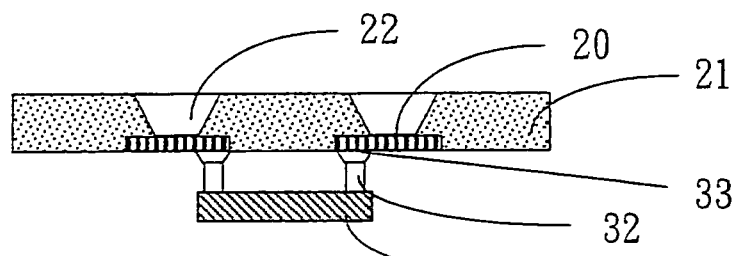
FIG. 9 to FIG. 14 are detailed flowcharts of manufacturing and connecting an independent semiconductor package to a chip exemplified by three different chip packages according to a first embodiment of the invention.
Figure 10:
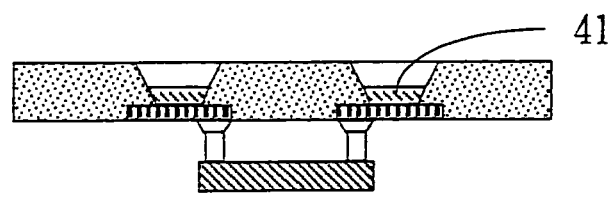

Referring to FIG. 9, an independent semiconductor package manufactured according to FIG. 8 is connected to a chip 31 via a second conductor. In the present embodiment of the invention, the second conductor is connected to the chip 31 via a solder 33 and a pillar bump 32. Besides, as indicated in FIG. 10, the hole 22 can be fully or partly filled with a conductive material, such as nickel, gold, copper or solder, to form a second conductive layer 41. In the present embodiment of the invention, the conductive material is formed by solder 41 to facilitate subsequent processing.

Figure 11:
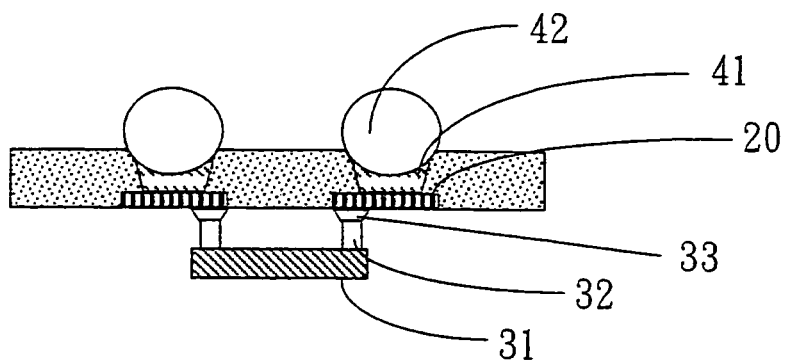

Referring to FIG. 11, the conductor 42 is fixed on the independent semiconductor package via position-setting of the holes 22, such that the signal of the he chip 31 is transmitted externally via pillar bump 32, the solder 33, the trace layer 20, and the conductor 42. In the present embodiment of the invention, the conductor 42 is a solder ball or a trace and the conductor 42 could be used to connect to printed circuit board (PC Board) or another layer of receiving substrate. To avoid the solder of the solder ball flowing everywhere when melted, the positioning unit limits is for confining the solder to be within the hole 22. In the present embodiment of the invention, the positioning unit is a hole 22, which can be a run through hole or an indent only.

The solder 41 enables the electrically connection between the conductor 42 and the trace layer 20 even more tightly, and avoids the occurrence of bubbles which occurs when a solder ball is used as the conductor 42 but can not completely fill up the hole 22.

Figure 12:
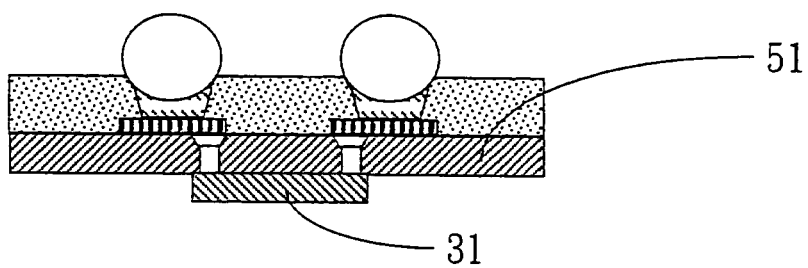
Figure 13:
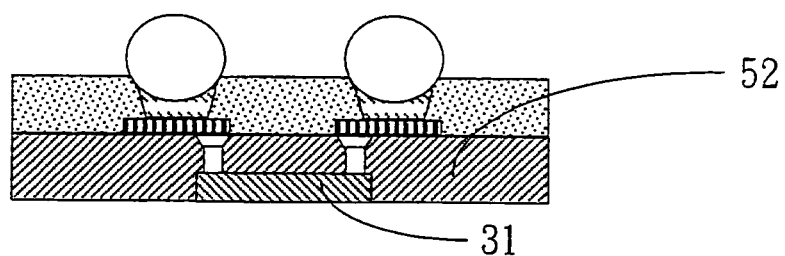
Figure 14:
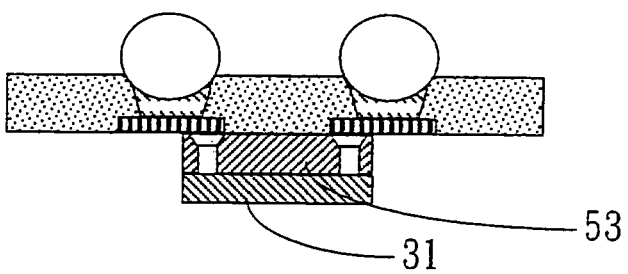

On the other hand, the independent semiconductor package and the package of the chip 31 can be flexible. Referring to FIG. 12, an insulating material, such as an encapsulating material, can be used as a second insulating layer 51 and infused to the chip 31 to encapsulate the pillar bump 32 but exposes the chip 31. Or, as indicated in FIG. 13, the second insulating layer 52 encapsulates the pillar bump 32 and the chip 31 but exposes the upper surface of the chip 31. Or, as indicated in FIG. 14, the second insulating layer 53 encapsulates the pillar bump 32 but is aligned with the chip 31.

Figure 15:
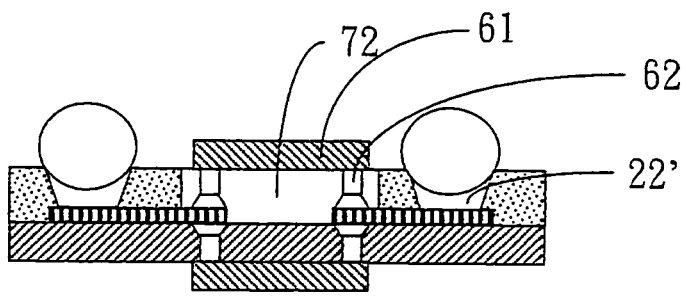
FIG. 15 is an example of the first embodiment of the invention used in a multi-chip package.

Besides, the semiconductor package is also used in a multi-chip package. Referring to FIG. 15, a space 72 permitting the chip 61 to be fixed and connected to the trace is disposed in addition to the hole of the first insulating layer, and the chip is connected to the solder ball via a hole 22'.

Figure 16:
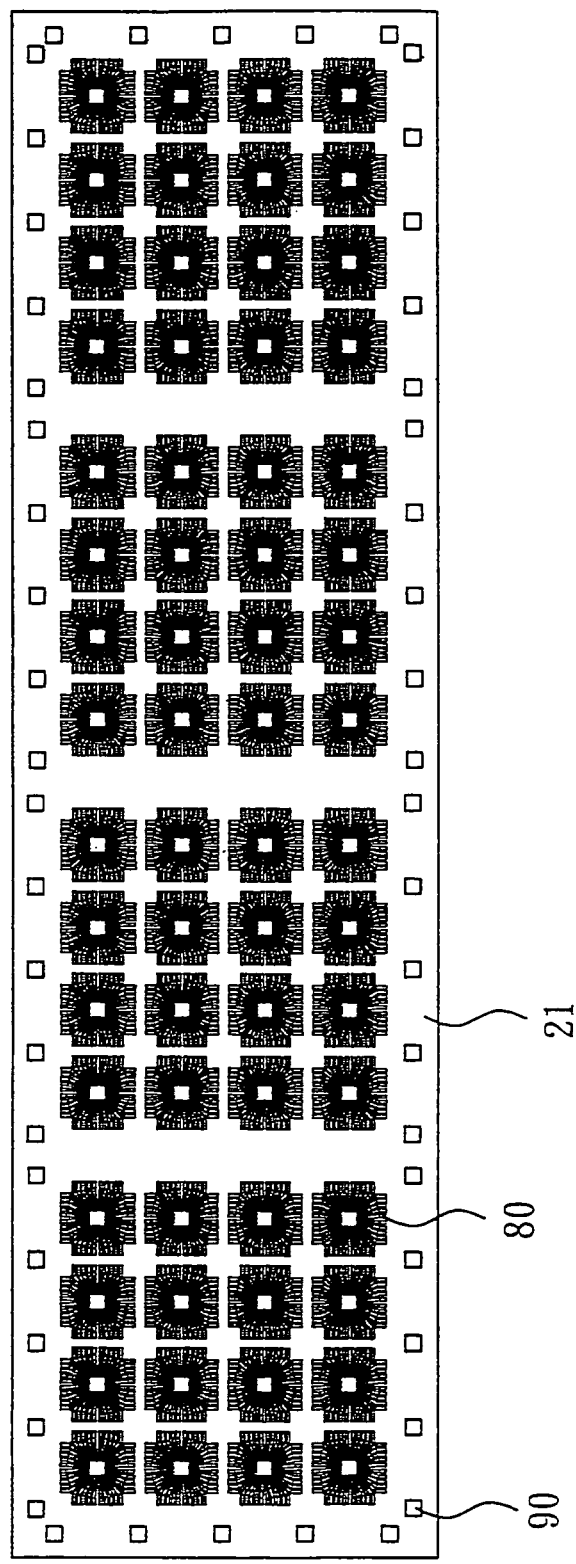
FIG. 16 to FIG. 17 are detailed diagrams before the package elements of the first embodiment of the invention are packaged.
Figure 17:
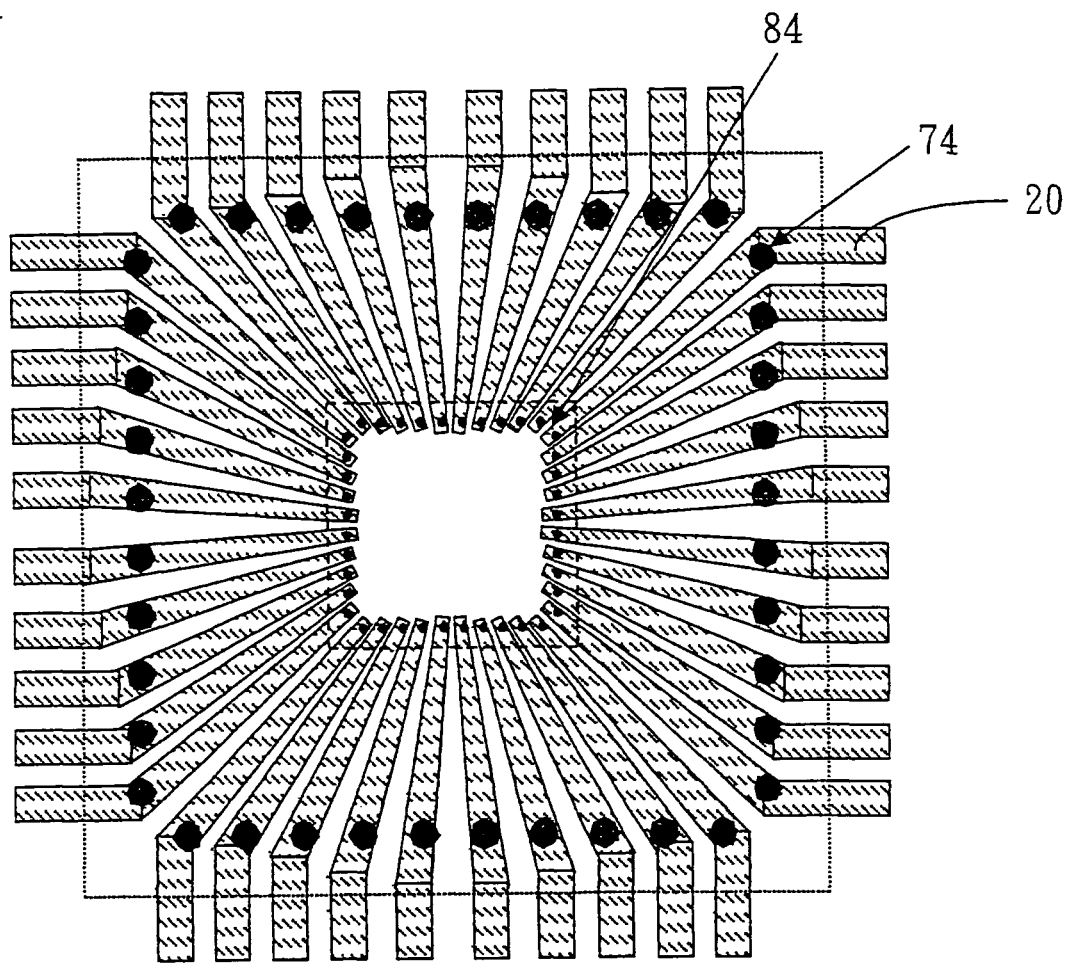

Referring to FIG. 16, a perspective of a lead frame according to a first embodiment of the invention is shown. FIG. 16 is bottom view of FIG. 8, wherein the package trace layout unit 80 formed by a first conductive layer is embedded in the first insulating layer 21, and a plurality of fiducial marks 90 are used for positioning a lead frame when the chip is packaged. In the present embodiment of the invention, the shape of individual package trace layout unit 80 is indicated in FIG. 17. A package trace layout unit 80 comprises a plurality of electrically isolated package traces to form the pattern of a package trace layout unit and correspond to a to-be-packaged chip, wherein smaller chips are electrically connected via the conductive dots 84, and larger chips are electrically connected via the conductive dots 74. Thus, it can be used as the lead frame of different sized chips in the present embodiment of the invention. As indicated in FIG. 16 and FIG. 17, the package trace layout units 80 substantially have the same pattern, and the package trace layout units 80, isolated between each other, are arranged in a matrix and embedded in the first insulating layer 21.

Each package trace layout unit 80 preferably has a fan-in or fan-out pattern. The first conductive layer 20 and the second conductive layer 41 can have different pitches to achieve the function of fine pitch.

Second Embodiment

Figure 18:
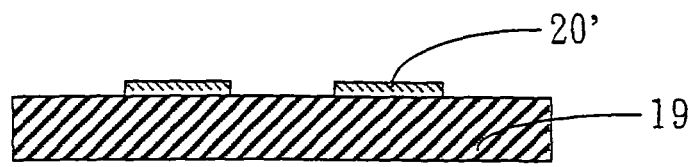
FIG. 18 to FIG. 25 are diagrams of manufacturing an independent semiconductor package according to a second embodiment of the invention.

Referring to FIG. 18 and onwards, a method of manufacturing a semiconductor package according to a second embodiment of the invention is shown. Firstly, a carrier 19 is provided, wherein the carrier 19 is made from copper in the present embodiment of the invention. Like FIG. 1 to FIG. 4 of the first embodiment, other manufacturing methods obtain the stage result as indicated in FIG. 18, a patterned first conductive layer 20' is formed on the carrier 19.

Figure 19:
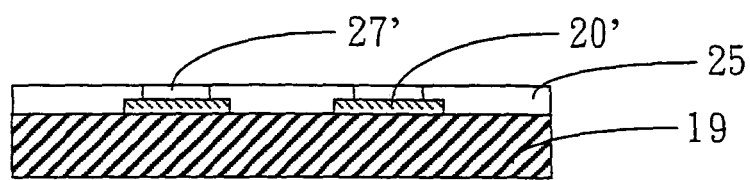
Figure 20:
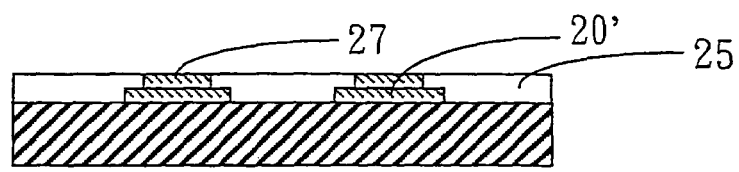

Referring to FIG. 19, a layer photo-resist layer 25 is coated on the first conductive layer 20', and a hole 27' is formed on the patterned photo-resist layer 25. Referring to FIG. 20, a second conductive layer 27 is formed in the hole 27'. In the present embodiment of the invention, the second conductive layer 27 is formed by way of electroplating and is substantially flat nor protruded from the surface of the first insulating layer 28.

Figure 21:
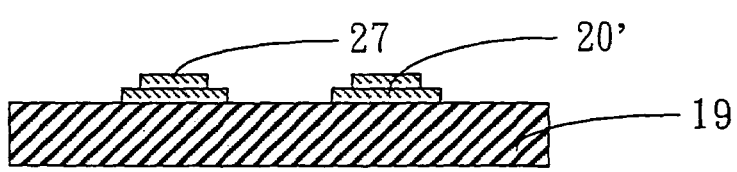
Figure 22:
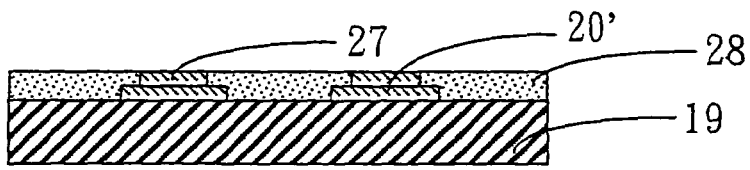

The photo-resist layer 25 is removed such that a patterned first conductive layer 20' and a second conductive layer 27 are obtained as indicated in FIG. 21. Referring to FIG. 22, a molding material is injected to form a first insulating layer 28, such that the patterned first conductive layer 20' and the second conductive layer 27 are embedded in the first insulating layer 28. In the present embodiment of the invention, the molding material used to form the first insulating layer 28 is epoxy resin, the elastic modulus of the molding material is greater than 1.0 GPa, but the CTE value of the elastic modulus is less than 10 ppm.

Figure 23:
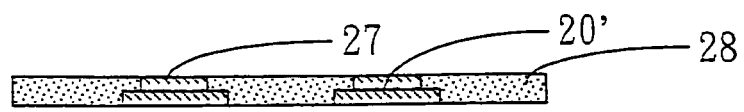
Figure 24:
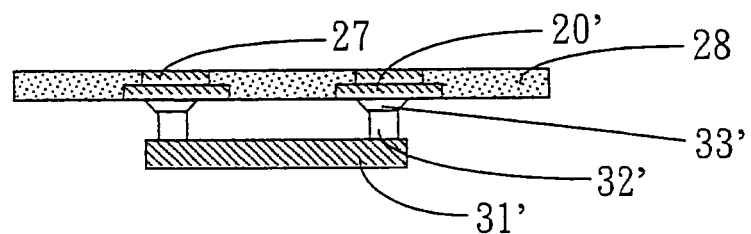

By way of etching, the carrier 19 is removed to obtain a semiconductor package before package as indicated in FIG. 23. The application of the unpackaged semiconductor package is indicated in FIG. 24, and the unpackaged semiconductor package can be connected to the chip 31' via the solder 33', the pillar bump 32'.

Besides, the second conductive layer 27 can be pretreated to resolve the resin residue problem arising in a QFN package when the tape is removed.

Figure 25:
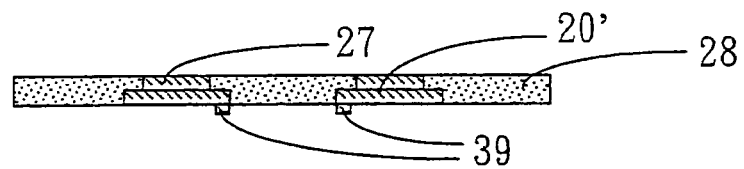

Referring to FIG. 25, a conductive protrusion 39 can be disposed on the first conductive layer 20' of the package trace layout. The conductive protrusion 39 can be made from silver, gold, other metals or conductive materials, and the part of the package trace layout directly atop of the conductive protrusion is the molding material of the first insulating layer 28. Thus, when the unpackaged semiconductor package is used in conventional wiring bonding, the trace can be connected to the conductive protrusion 39 such that the lead frame neighbors the chip package as close as possible and will not wobble when connected to the traces, hence increasing the efficiency of bonding the wire to the chip.

Third Embodiment

Figure 26:
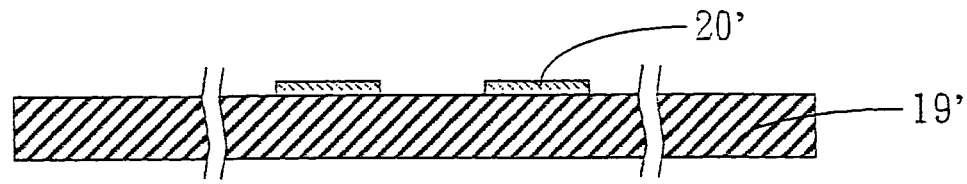
FIG. 26 to FIG. 36 are diagrams of manufacturing an independent semiconductor package according to a third embodiment of the invention.

Referring to FIG. 26 and onwards, a method of manufacturing a semiconductor package according to a third embodiment of the invention is shown. Firstly, a carrier 19' is provided, wherein the carrier 19' is made from copper in the present embodiment of the invention. Like FIG. 1 to FIG. 4 of the first embodiment, other manufacturing methods obtain the stage result as indicated in FIG. 26, a patterned first conductive layer 20' is formed on the carrier 19'.

Figure 27:
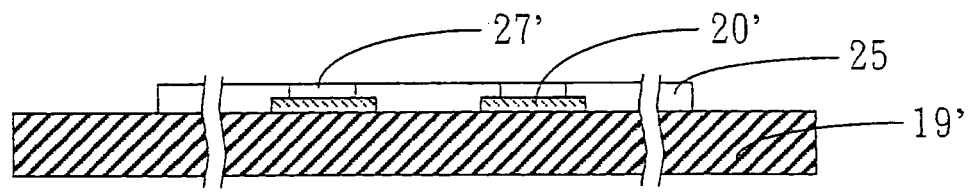
Figure 28:
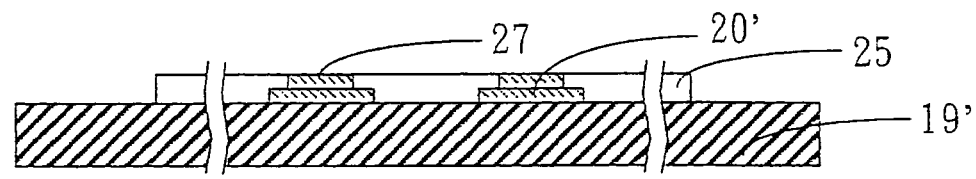

Referring to FIG. 27, a layer photo-resist layer 25 is coated on the first conductive layer 20', and a hole 27' is formed on the patterned photo-resist layer 25. Referring to FIG. 28, a second conductive layer 27 is formed in the hole 27'. In the present embodiment of the invention, the second conductive layer 27 is formed by way of electroplating and is substantially flat nor protruded from the surface of the first insulating layer 28.

Figure 29:
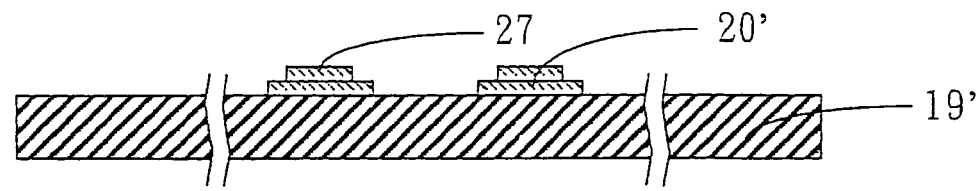
Figure 30:
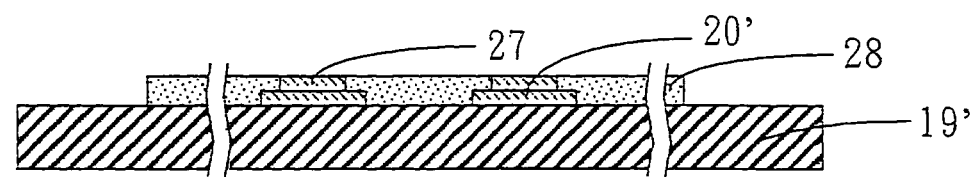

The photo-resist layer 25 is removed such that a patterned first conductive layer 20' and a second conductive layer 27 are obtained as indicated in FIG. 29. Referring to FIG. 30, a molding material is injected to form a first insulating layer 28, such that the patterned first conductive layer 20' and the second conductive layer 27 are embedded in the first insulating layer 28. In the present embodiment of the invention, the molding material used to form the first insulating layer 28 is epoxy resin, the elastic modulus of the molding material is greater than 1.0 GPa, but the CTE value of the elastic modulus is less than 10 ppm.

By way of etching, part of the carrier 19' is selectly removed to obtain a semiconductor package before package as indicated in FIGS. 31-35.

Figure 31:
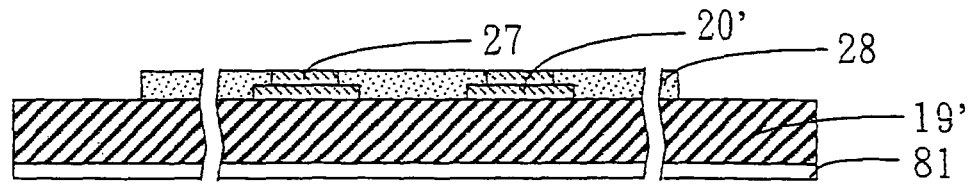
Figure 32:
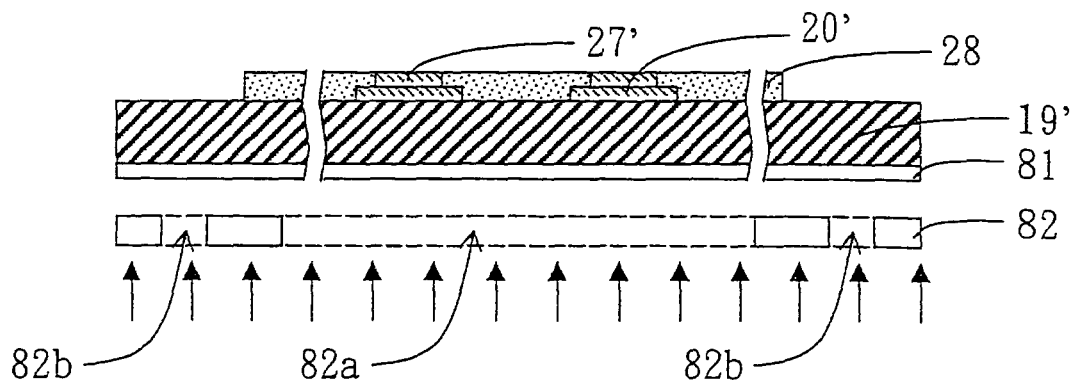
Figure 33:
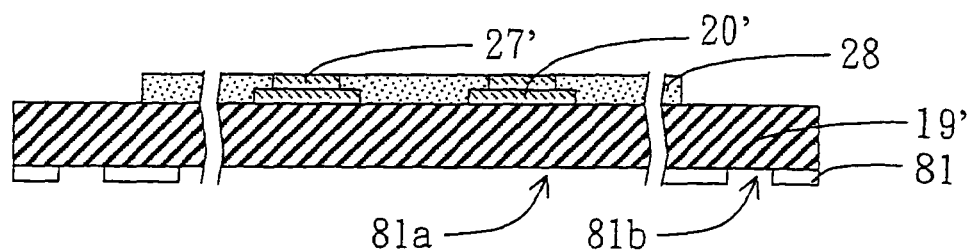

Referring to FIG. 31, a photo resist layer 81 is formed on the carrier 19'. Then the photo resist layer 81 is exposed via a mask 82 having at least a first opening 82a and at least a second opening 82b as shown in FIG. 32. And a patterned photo resist layer 81 having at least a first opening 81a and at least a second opening 81b is obtained as indicated in FIG. 33. Wherein the first opening 81a and the first opening 82a are corresponding with the inside area of the first insulating layer 28, and the second opening 81b and the second opening 82b are corresponding with the outside area of the first insulating layer 28.

Figure 34:
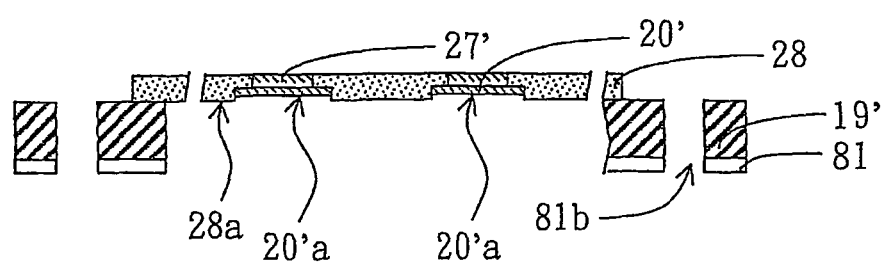
Figure 35:
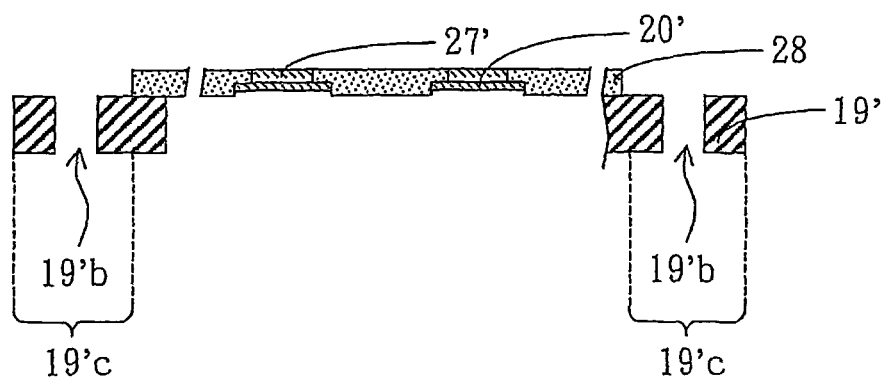

Afterwards, referring to FIG. 34, the carrier 19' is etched by taking the patterned photo resist layer 81 as a mask. Wherein the carrier 19' and part of the first conductive layer 20' are etched simultaneously so that the surface 20'a of the first conductive layer 20' and the surface 28a of the first insulating layer 28 are not located at the same plane. Then, the patterned photo resist layer 81 is removed so that an enforcement ring 19'c and at least a positioning hole 19'b are formed on the carrier 19' as indicated in FIG. 35.

Figure 36:
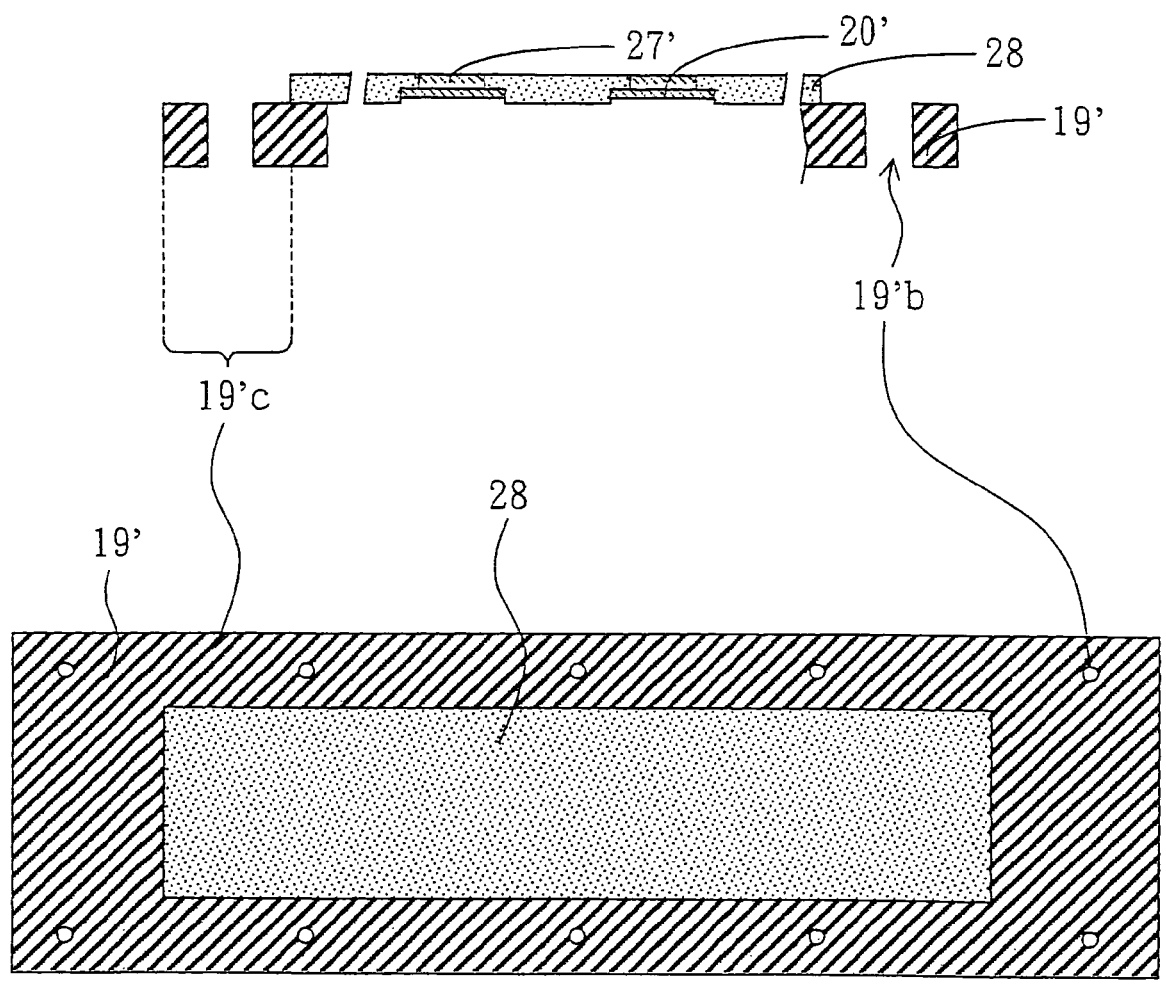

Please refer to FIG. 36. After part of the carrier 19' is selectly removed, the enforcement ring 19'c is formed on the peripheral area of the carrier 19' and the positioning hole 19'b are formed in the enforcement ring 19'c. The semiconductor package can be carried via the enforcement ring 19'c and the position hole 19'b without touching the first insulating layer 28 or the second conductive layer 27. Therefore, the scraping damage of the semiconductor package can be prevented.

The conductive layer 20 or 20' (the package trace) is formed during the manufacturing process without applying extra process such as micro-filming, exposure and etching on the conductive layer, so that the conductive layer is not restricted by the etching pitch and the reliability of the package trace will not be affected by undercutting. However, the package trace meets the requirement of miniaturization in the semiconductor element better.

The package trace layout unit has a fan-in or fan-out pattern to achieve the function of fine pitch.

Moreover, the hole 22 (the positioning unit) makes the positioning setting of connecting the solder ball to the package element more precisely, and avoids the overflowing of the solder when melted.

Besides, the mold 23, and hole 22 (the positioning unit) are formed by using the material of the first insulating layer 21 directly, such that the first insulating layer 21 and the positioning unit are formed by one filling of the molding material, largely simplifying the manufacturing process of the semiconductor package.

Moreover, according to FIG. 11, with the disposition of the package trace 20, the pitch between the solder balls can be larger than the pitch between the chip bumps 32. Therefore, the technology of the invention can be applied to a manufacturing process with a lower requirement of the pitch.

Furthermore, the first insulating layer 21 uses a molding material as a carrier for the package trace pattern, therefore the package trace patterns are not connected by metallic traces and are different form conventional lead frame which has traces for connecting the package trace patterns. The insulating layer between the traces of the lead frame is simply used for insulating purpose and can not be used as a carrier. As a result, in the embodiments of the invention does not have the connecting traces for connecting the lead frame patterns, and each package has an individual pattern, and is easier for cutting.

In a conventional chip, the package traces are connected via metallic traces, therefore the package traces must be divided first before the chip can be tested individually. In the above embodiments, as each package trace pattern is electrically isolated and does not have metallic traces for connection, the chip still can be tested even after the chip is connected to the package trace, largely saving time and cost for testing.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures. For example, the first insulating layer 21, is not necessarily limited to one layer. Any one who is skilled in the technology of the invention can use several materials to compose a compound insulating layer in several times of formation or use the same material to compose an insulating layer in several times of formation, and such modifications are still within the scope of protection of the invention which is defined in the appended claims.

What is claimed is:

1. A semiconductor package, comprising:
   an insulating layer having a first surface and a second surface opposite the first surface, wherein a package trace layout comprising a plurality of traces is embedded in the insulating layer between the first surface and the second surface of the insulating layer, the plurality of traces are entirely exposed and recessed on the first surface of the insulating layer to form a recessed pattern such that an exposed surface of the embedded traces is not on the same plane as the first surface of the insulating layer;
   a semiconductor chip disposed on the first surface of the insulating layer and comprises a plurality of conductors connecting the semiconductor chip to the package trace layout, wherein an inner part of the package trace layout lies inside an area of the semiconductor chip, the conductors are disposed between the semiconductor chip and the inner part of the package trace layout, and extend from a surface of the semiconductor chip to the embedded traces of the inner part of the package trace layout; and
   an encapsulating layer disposed on the first surface of the insulating layer and encapsulates the semiconductor chip, wherein an outer part of the package trace layout lies outside the area of the semiconductor chip, the encapsulating layer further fills the trace pattern and encapsulates the embedded traces of the outer part of the package trace layout.

2. The semiconductor package according to claim 1, wherein the conductors connect to the embedded traces.

3. The semiconductor package according to claim 2, wherein each of the plurality of conductors is a pillar bump or a solder bump.

4. The semiconductor package according to claim 3, wherein each of the pillar bumps comprises a pillar part and a solder part, the solder part is connected to the exposed surface of the embedded traces in the recessed pattern, and the pillar part is above the recessed pattern and connects the solder part to the semiconductor chip.

5. The semiconductor package according to claim 1, wherein the embedded traces in the inner part of the package trace layout fan out to the outer part of the package trace layout.

6. A semiconductor package, comprising:
   an insulating layer having a first surface and a second surface opposite the first surface, wherein a package trace layout comprising a plurality of traces is embedded in the insulating layer between the first surface and the second surface of the insulating layer, the plurality of traces are entirely exposed and recessed on the first surface of the insulating layer to form a recessed pattern such that an exposed surface of the embedded traces is not on the same plane as the first surface of the insulating layer;
   a semiconductor chip disposed on the first surface of the insulating layer and comprises a plurality of wires connecting the semiconductor chip to the package trace layout, wherein an outer part of the package trace layout lies outside an area of the semiconductor chip, the wires extend from a surface of the semiconductor chip to the embedded traces of the outer part of the package trace layout; and
   an encapsulating layer disposed on the first surface of the insulating layer and encapsulates the semiconductor chip, wherein the encapsulating layer further fills the recessed pattern and encapsulates the embedded traces of the outer part of the package trace layout.

7. The semiconductor package according to claim 6, further comprising a plurality of conductive protrusions disposed on part of the exposed surface of the embedded traces in the recessed pattern and extend to or above the first surface of the insulating layer, wherein the wires are bonded to the conductive protrusions.

8. The semiconductor package according to claim 7, wherein the conductive protrusions comprise gold.

9. The semiconductor package according to claim 6, wherein the embedded traces in the outer part of the package trace layout fan in to the inner part of the package trace layout.

10. The semiconductor package according to claim 1 or 6, further comprising a plurality of pillars embedded in the insulating layer between the first surface and the second surface of the insulating layer, wherein the pillars are connected to the traces.

* * * * *